(12) United States Patent
Krywanczyk et al.

(10) Patent No.: US 7,844,099 B2
(45) Date of Patent: Nov. 30, 2010

(54) INSPECTION METHOD FOR PROTECTING IMAGE SENSOR DEVICES WITH FRONT SURFACE PROTECTION

(75) Inventors: Timothy C. Krywanczyk, Essex Junction, VT (US); Timothy E. Neary, Essex Junction, VT (US); Erik M. Probstfield, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1050 days.

(21) Appl. No.: 11/559,990

(22) Filed: Nov. 15, 2006

(65) Prior Publication Data

US 2008/0113458 A1 May 15, 2008

(51) Int. Cl.
*G06K 9/00* (2006.01)

(52) U.S. Cl. .................. 382/144; 382/145; 382/146; 382/147; 382/148; 382/149

(58) Field of Classification Search .................. 382/144, 382/145, 147, 148, 149, 150
See application file for complete search history.

(56) References Cited

U.S. PATENT DOCUMENTS

| 4,489,487 | A | 12/1984 | Bura |
| 5,641,714 | A | 6/1997 | Yamanaka |
| 5,851,664 | A | 12/1998 | Bennett et al. |
| 5,956,163 | A | 9/1999 | Clarke et al. |
| 6,692,978 | B2 | 2/2004 | Tandy et al. |
| 6,731,787 | B1 * | 5/2004 | Vacca et al. ................. 382/145 |
| 6,956,283 | B1 | 10/2005 | Peterson |
| 7,009,287 | B2 | 3/2006 | Sun et al. |
| 7,388,979 | B2 * | 6/2008 | Sakai et al. ................. 382/149 |
| 2003/0082587 | A1 | 5/2003 | Seul et al. |
| 2005/0275116 | A1 | 12/2005 | Tan et al. |
| 2006/0040086 | A1 | 2/2006 | Dolechek et al. |
| 2006/0068524 | A1 | 3/2006 | Yamamoto |
| 2006/0089004 | A1 | 4/2006 | Yamamoto |

FOREIGN PATENT DOCUMENTS

JP 2005158782 A 6/2005

\* cited by examiner

*Primary Examiner*—Matthew C Bella
*Assistant Examiner*—Mike Rahmjoo
(74) *Attorney, Agent, or Firm*—Scully, Scott, Murphy & Presser, P.C.; Anthony J. Canale

(57) ABSTRACT

A method for inspecting a semiconductor wafer fabricated for image sensing operation that has had a transparent protective tape layer applied to a front or active wafer surface. The method includes quantifying chip defects in the image sensor wafer that lie under the protective layer using automatic disposition equipment.

6 Claims, 1 Drawing Sheet

INSPECTION METHOD FOR PROTECTING IMAGE SENSOR DEVICES WITH FRONT SURFACE PROTECTION

BACKGROUND OF THE INVENTION

1. Field of the Invention

The present invention relates to semiconductor image sensors. More particularly, the inventions described and claimed herein relate to a method for inspecting and testing a semiconductor image sensor wafer and device that has had a protective layer applied to its front surface.

2. Description of the Related Art

Semiconductor fabrication processes are well established. In semiconductor fabrication, semiconductor wafers are modified and transformed in a series of multiple processing steps to create desirable features on the finished semiconductor chip or finished module. Image sensors are semiconductor chips fabricated to receive and capture light image information (e.g., intensity information) and directly convert the captured light information to form a digital image. Image sensors are classified as charge-coupled devices (CCDs) and complimentary metal oxide semiconductor (CMOS) devices. CCD image sensors capture light onto an array of light sensitive diodes, where each diode represents a pixel. The pixel converts the light photons into commensurate electric charge, which is accumulated by a charge-coupling operation to generate each pixel's signal. CMOS image sensors, like CCD image sensors, include an array of photosensitive diodes, with one diode allocated for each pixel. They differ however in that each CMOS-based pixel includes its own amplifier and may be read directly on an x-y coordinate system rather than by the charge-coupling process required by CCD-based image sensors.

The reader should note that the percentage of a pixel area on the active wafer surface that actually captures light is called the pixel "fill factor." This light capturing or active area is typically about 40% of the allocated pixel surface area. The remainder of the allocated pixel area surface is used for various purposes known to the skilled artisan. In some image sensor pixel designs, the fill factor is too small to be effective for particular imaging applications. To accommodate this problem, the image sensor allocated pixel area surface may include small lenses (i.e., microlenses) formed directly above each pixel. The microlens focuses the incident light received at the pixel area towards the active area or light-capturing portion of the allocated pixel surface area. This effectively increases the fill factor, for example, up to three (3) times.

Because the active or light-capturing portion of each pixel's allocated surface area (with or without microlenses) is light responsive, it follows that pixel operation is extremely sensitive to contamination, e.g., dust particles that may accumulate thereon, and surface damage such as scratching which may occur in various post-fabrication handling processes. The contamination and damage may block or limit accurate capture of the light incident on affected pixel areas. That is, contamination particles can block or modify incident light received thereon and sensed by the photodiodes comprising the image sensor. This can cause the individual sensors to fail testing, and may show up in an image acquired by a damaged or contaminated image sensor that nevertheless passes testing. For that matter, wafer testing may generate contamination such aluminum (Al) particles that are scraped up by probe needles, picked up and deposited elsewhere on the active or front surface.

Conventionally, image sensor fabrication and post-fabrication processes are carried out in clean rooms, or under clean room conditions to avoid contamination by dust and other debris. To avoid damaging the front surfaces with or without microlenses, finished wafers are stacked (stored) and transported using crystal packs, which increase manufacturing cost. Since wafer test assembly areas are typically not controlled to the same standards maintained within cleanrooms for wafer fabrication, contamination of image sensor wafers is a key challenge to high yield manufacturing. For that matter, merely stacking the image sensor wafers between processes can damage very sensitive microlenses.

To overcome such sensor surface contamination problems, U.S. patent application Ser. No. 11/559,983, commonly-owned and filed concurrently herewith, teaches a method that includes applying a protective tape layer to the active or front surface of the fabricated image sensor wafer. The protective tape is preferably a "zero-washing" tape, or any known tape normally used during fabrication. For example, back-grinding tapes that are normally used for application to a backside of a semiconductor wafer during grinding processes will effectively protect the front surface when applied post-fabrication. Protective tapes are preferably light transparent to facilitate inspection, testing, storage, cutting and dicing, and/or transportation to other locations for assembly, etc., to protect against front surface damage, or accumulated contamination that might otherwise affect sensor operation. That is, debris generated from the wafer testing, dust particles and the like accumulates on the protective tape layer rather than being deposited on the active sensor surface. Preferably after assembly to module form, the tape is merely peeled off the active light-capturing surfaces.

While the Ser. No. 11/559,983 application is known to protect the front surface of image sensor wafer post-fabrication by the application of the protective layer, there is no method or process known which allows for inspection and quantification of the quality of the wafer after the protective layer is applied. It would be desirable in the semiconductor industry to have a method that allows for inspection of image sensor wafers that have front surfaces covered by a protective layer.

SUMMARY OF THE INVENTION

To that end, the invention described and set forth herein includes a method for performing quality inspection of image sensor wafers and devices that have had their front surface covered with a protective layer of tape during any portion of a process for fabricating image sensor wafers and image sensor wafer assembly. The novel inspection method includes inspecting with automated or manual equipment for known or classical defects in any environment or location required to be used for the inspection, with little regard for environmental conditions, for example, a clean room factory. More particularly, the novel method may include optical inspection through the protective tape layer, and/or digitally imaging the front surface through the protective tape layer.

In a preferred embodiment, the inventive method includes inspecting a semiconductor wafer fabricated for image sensing operation that has had a transparent protective tape layer applied to a front or active wafer surface, the method comprising the step of quantifying chip defects in the image sensor wafer that lie under the protective layer using automatic disposition equipment. The step of quantifying may further include manual image sensor wafer inspection by a trained quality inspector. More the claimed method for inspecting may include that the protective layer is removed and reapplied to facilitate quantifying and controlling wafer and/or chip defects.

BRIEF DESCRIPTION OF THE DRAWINGS

The foregoing and other objects, aspects and advantages will be better understood from the following detailed description of embodiments of the inventions, with reference to the drawings, in which.

DETAILED DESCRIPTION OF THE INVENTION

Figure 1:
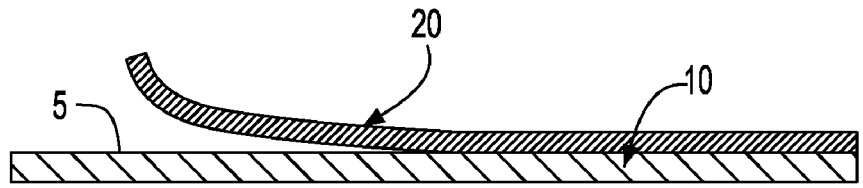
FIG. 1 shows a semiconductor wafer comprising one or more image sensors as the protective tape is applied.

The inventive method for inspecting front-protected semiconductor image sensor wafers as set forth and described herein is disclosed for the purpose of conveying the broad inventive concept. In particular, the drawings and descriptions provided are not meant to limit the scope and spirit of the invention in any way as claimed in the claim set appended hereto. To that end, reference will now be made in detail to the present invention, examples of which are illustrated in the accompanying drawings, wherein like reference numerals refer to like elements throughout.

The reader's attention is first directed to FIG. 1, which depicts one known method for protecting an active surface 5 of a semiconductor wafer, 10 fabricated for image sensor chip manufacture. The known method includes applying a protective layer of tape 20 to the front or active surface 5 of the semiconductor wafer 10. The tape may be one of pressure sensitive or photosensitive. The tape should be readily transparent to facilitate the novel inspection and/or testing of the protected wafers in accord with the present invention.

The benefits to semiconductor manufacturers who utilize the inventive method for inspecting the protected image sensor wafers are many. For example, the inspecting may be carried out in a clean room factory or manufacturing facility where less critical environmental controls are in place than would normally be required to test image sensor wafers and devices. More, the inspective method may be readily carried out on known automated wafer inspection tools, with a small modification to their conventional inspection process(es).

In more detail, conventional image sensor chip manufacturing processes include shipping sensor wafers or devices directly from the wafer/device fabricator. The reason for this activity relates to concern about contamination that could accumulate on, or physical damage that could occur the front or active surface of the wafers/devices, negatively impacting the function of the image capture sensors or pixels thereon. At that point in the manufacturing process, there is typically no "outgoing" inspection of wafer/device quality currently in place. It is the suppliers at whose facilities the wafers/devices are built and assembled that typically have automatic disposition equipment to carry out "incoming" quality inspections.

When a transparent protective layer has been applied to the front surface of the incoming image sensor wafers/devices, the wafers are readily shipped anywhere for assembly, where the transparent tape allows qualification and control of the defects that may cause yield and quality control failures. The inventive inspection method is carried out on the disposition devices and other automated wafer inspection tools arranged or tuned to look through the transparent tape layer on the front surface. The disposition of the wafers/devices is based on detecting defects under the transparent tape layer.

Under certain circumstances, however, the quality inspection and disposition must be carried out manually. This may occur where defects may be known to be under the protective layer but out of the focal plane of inspection for the automated disposition or other known inspection tools. That is, the method may be carried out by trained quality inspectors who are able to inspect the areas under the protective tape where the defects are known to likely reside.

Figure 2:
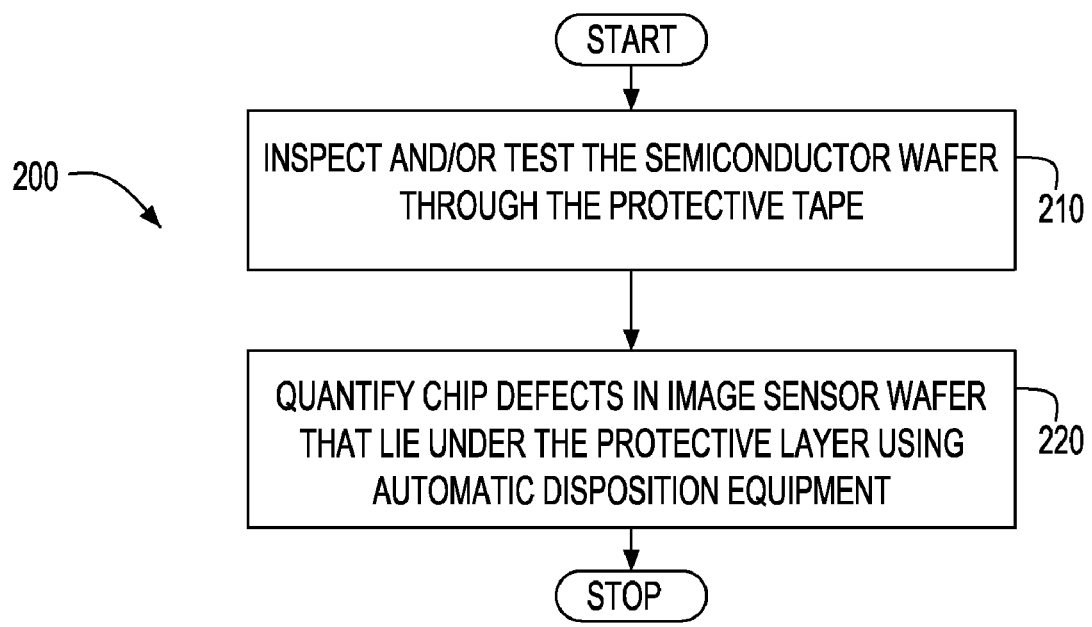
FIG. 2 depicts a schematic block diagram of a method for inspecting a front surface of a semiconductor image sensor wafer of the invention.

FIG. 2 is a flow block diagram that depicts a method 200 for inspecting a semiconductor wafer fabricated for image sensing operation which has had a protective tape layer applied to its front or active wafer/device surface. Block 210 represents a step of receiving the image sensor/wafer from a fabrication house or facility, local or distant storage, etc. Block 220 represents a step of inspecting the semiconductor wafer through the protective tape layer using automatic disposition equipment. Block 220' represents a step where automatic inspection is not reliable, so that a trained quality inspector carries out the inspection for defects under the tape, e.g., where the defects may be out of the focal plane for automatic inspection.

The skilled semiconductor practitioners should understand that while the exemplary method and computer readable medium that embodies the method in a set of computer-readable and computer-implementable instructions calls out novel inspecting and/or testing in varied non-conventional environments, where the image sensing wafers covered with the protective tape, the method may include removal, and re-application of the tape to facilitate inspection processes at any point in the inventive method without deviating from the scope and spirit of the invention.

Although a few examples of the present invention have been shown and described, it would be appreciated by those skilled in the art that changes may be made in these embodiments without departing from the principles and spirit of the invention, the scope of which is defined in the claims and their equivalents.

What is claimed is:

1. A method for inspecting a semiconductor wafer fabricated for image sensing operation that has had a transparent protective tape layer applied to a front or active wafer surface, the method comprising the step of:

providing, at a first location, a semiconductor wafer having an active surface including a plurality of image sensor chips, each chip having image capture pixels;

applying a layer of protective tape to said active surface;

transporting said semiconductor wafer having said active surface with said layer of protective tape thereon to a second location for assembly; and at said second location, quantifying chip defects in the image sensor wafer that lie under the protective tape layer using automatic disposition equipment, wherein the protective layer may be removed and reapplied to facilitate quantifying and controlling wafer and/or chip defects.

2. The method for inspecting as set forth in claim 1, further comprising a step of controlling assembling with the inspected image sensor wafer based on said chip quantifying.

3. The method for inspecting as set forth in claim 1, wherein the automatic disposition equipment has been modified to accommodate inspecting for defects under the protective tape layer.

4. The method for inspecting as set forth in claim 1, wherein the step of quantifying includes manual image sensor wafer inspection by a trained quality inspector.

5. The method for inspecting as set forth in claim 4, wherein said manual image sensor wafer inspection enables detecting defects known to be under the protective layer but out of the focal plane of inspection of the automatic disposition equipment.

6. The method for inspecting as set forth in claim 1, wherein said second location is a manufacturing facility having less critical environmental controls than a clean room.

* * * * *